United States Patent [19]

Watanabe et al.

[11] Patent Number: 4,965,576
[45] Date of Patent: Oct. 23, 1990

[54] ERROR CORRECTING SYSTEM CAPABLE OF EFFECTIVELY USING AN ALLOWABLE FREQUENCY BAND

[75] Inventors: Masayoshi Watanabe; Seiichi Noda, both of Tokyo, Japan

[73] Assignee: NEC Corporation, Tokyo, Japan

[21] Appl. No.: 290,500

[22] Filed: Dec. 27, 1988

[30] Foreign Application Priority Data

Dec. 24, 1987 [JP] Japan .................. 62-328047

[51] Int. Cl.$^5$ .......................................... H03M 13/00
[52] U.S. Cl. .................................. 341/94; 341/50; 371/30; 371/37.7
[58] Field of Search ............... 341/50, 51, 59, 67, 341/94; 371/32, 38, 40, 51; 360/15, 48, 53

[56] References Cited

U.S. PATENT DOCUMENTS

| | | | |
|---|---|---|---|
| 4,151,562 | 4/1979 | Tregay | 358/433 |
| 4,422,171 | 12/1983 | Wortley et al. | 371/32 |
| 4,541,095 | 9/1985 | Vries | 371/37.1 |

*Primary Examiner*—William M. Shoop, Jr.
*Assistant Examiner*—Brian K. Young
*Attorney, Agent, or Firm*—Sughrue, Mion, Zinn, Macpeak & Seas

[57] ABSTRACT

In an encoder for use in encoding each input signal unit of N bits into each of error correcting codewords, each input signal unit is grouped into a plurality of parts which have bit lengths N1 and N2 in consideration of a transmission rate on a transmission path and which are individually encoded into partial encoded codewords which individually include redundancy signals, respectively. The partial encoded codewords may have different error correction ability and different code lengths. The partial encoded codewords are combined together into each of the error correcting codeword which may be transmitted to the transmission path at a transmission rate close to an allowable transmission rate of the transmission path. A decoder decodes each error correcting codeword into each of output signal units by dividing each error correcting codeword into divided codewords and by individually decoding the divided codewords.

4 Claims, 3 Drawing Sheets

ERROR CORRECTING SYSTEM CAPABLE OF EFFECTIVELY USING AN ALLOWABLE FREQUENCY BAND

BACKGROUND OF THE INVENTION

This invention relates to an error correcting system which comprises an encoder and a decoder to transmit and receive a sequence of error correcting codewords through a transmission path, such as a radio channel.

In an error correcting system of the type described, error correction has been performed in various manners so as to correct a single error, a double error, a triple error, a t-tuple error, or the like which might occur during transmission. At any rate, redundancy bit or bits are added as a redundancy signal in an encoder to each information signal unit (namely, input signal unit) which is composed of a predetermined bit number of information bits. A combination of the information bits and the redundancy bits is sent as an error correcting codeword from the encoder to a decoder. In the decoder, the error correcting codeword is decoded into the information bits with error or errors corrected by the use of the redundancy bits.

It is well known in the art that an increase of the redundancy bits brings about an increase of bits which can be corrected by the error correcting codewords. In other words, error correction is given a high ability with an increase of the redundancy bits. The ability of error correction may be referred to as an error correction ability. However, an increase of the redundancy bits results in a reduction of a transmission rate which is determined by an allowable frequency band of a transmission path. Therefore, the bit number of the redundancy bits should be selected in consideration of the allowable frequency band of the transmission path and the information bits included in each information signal unit.

The bit number of the information bits discretely and extensively increases as the number of the redundancy bits increases one by one. Such a discrete increase of the information bits makes it difficult to exactly adjust the error correcting codeword to the allowable frequency band. Under the circumstances, the error correcting codeword has a transmission rate which is very lower than an allowable transmission rate allowed by the allowable frequency band. This shows that an unused frequency band remains in the allowable frequency band at the sacrifice of the error correcting ability. In other words, neither the allowable frequency nor the error correcting ability of the error correcting codeword is effectively used in the conventional error correcting system.

SUMMARY OF THE INVENTION

It is an object of this invention to provide an error correcting system which can effectively use an allowable frequency band of a transmission path.

It is another object of this invention to provide an error correcting system of the type described, which can improve an error correcting ability in each error correcting codeword.

According to an aspect of this invention, an encoder is for use in encoding each of input signal units into each of error correcting codewords. The encoder comprises grouping means responsive to each of the input signal units for grouping each of the input signal units into a plurality of signal parts or first through M-th encoded signal units, encoding means coupled to the grouping means for individually encoding, the signal parts into partial encoded codewords or first through M-th encoded signal units which include redundancy bits in addition to the signal parts, respectively, and means for combining the partial encoded codewords into each of the error correcting codewords.

According to another aspect of this invention, a decoder is for use in decoding a sequence of reception signal units each of which is produced by dividing each of the input signal units into a plurality of signal parts, by individually encoding the signal parts into partial encoded codewords which include redundancy bits in addition to the input signal units, and by combining the partial encoded codewords. The decoder comprises dividing means for dividing each of the reception signal units into divided codewords representative of the partial encoded codewords, decoding means for decoding the divided codewords into divided information parts representative of the signal parts, and means for combining the divided information parts into a reproduction of each of the input signal units.

DESCRIPTION OF THE PREFERRED EMBODIMENT

Figure 1:
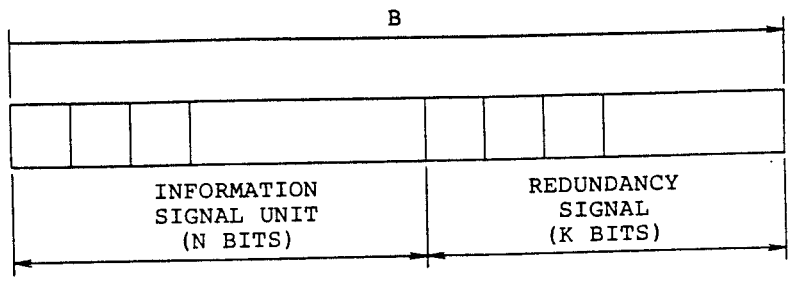
FIG. 1 is a signal format for use in describing a conventional error correcting system.

Referring to FIG. 1, description will be made as regards conventional error correction for a better understanding of this invention. In the example being illustrated, an error correcting codeword of a code length B bits is composed of an information signal unit of N bits and a redundancy signal of K bits which is added to the information signal unit, where N and K are integers which will presently be exemplified. Thus, the error correcting codeword has a code length of (N+K) bits. The numbers N and K have a relationship invariably determined at every code that may be a linear code, such as a Hamming code, a parity check code, a BCH code, or the like.

As to the Hamming code for correcting a single error, B and N are given by:

$$B = 2^K - 1$$

$$\text{and } N = 2^K - K - 1 \tag{1}$$

From Equation (1), it is readily understood that N may be equal to or smaller than 0, 1, 4, 11, 26, 57, 120, 247, 502 when K is equal to 1, 2, 3, 4, 5, 6, 7, 8, and 9, respectively, as known in the art. This shows that B becomes equal to or smaller than 1, 3, 7, 15, 31, 63, 127, 255, and 511 when K is changed from 1 to 9, respectively.

As to the linear code for correcting a double error, N may be equal to or smaller than 3, 11, and 20 when K is equal to 7, 9, and 10, respectively. In other words, B is equal to or smaller than 10, 20, and 30 when K=7, 9, and 10, respectively. The linear code for correcting the double error has an error correction ability higher than the Hamming code for the single error.

Under the circumstances, it is concluded that the code length B is discretely changed with an increase of K and that the information signal unit of N bits undesiredly becomes short with an increase of the error correction ability.

In the meanwhile, the error correcting codeword is transmitted through a transmission path, such as a radio channel, having a predetermined allowable frequency band. However, such a discrete change of the code length B makes it difficult to exactly adjust the code length to the predetermined allowable frequency band. Accordingly, an unused frequency band remains in the predetermined allowable frequency band, as pointed out in the preamble of the instant specification.

Figure 2:
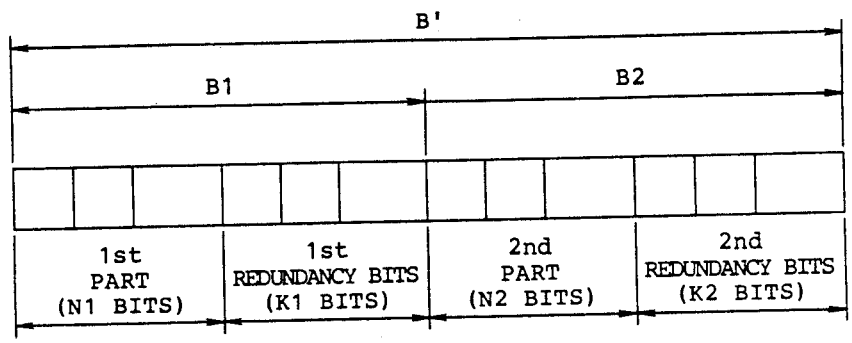
FIG. 2 is a signal format for use in describing an error correcting system according to a preferred embodiment of this invention.
Figure 3:
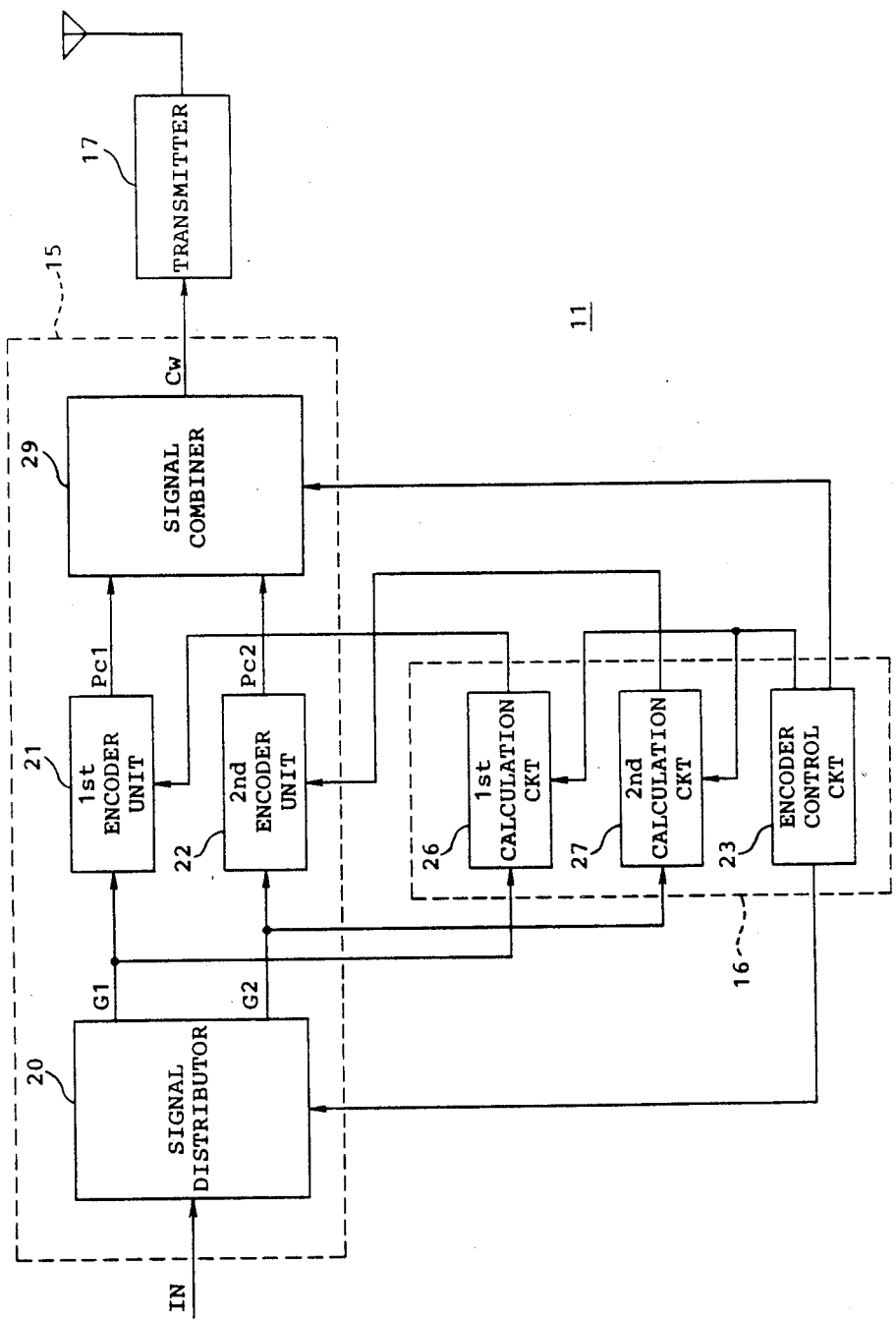
FIG. 3 is a block diagram of an encoder used in the error correcting system which can implement the signal format shown in FIG. 2.
Figure 4:
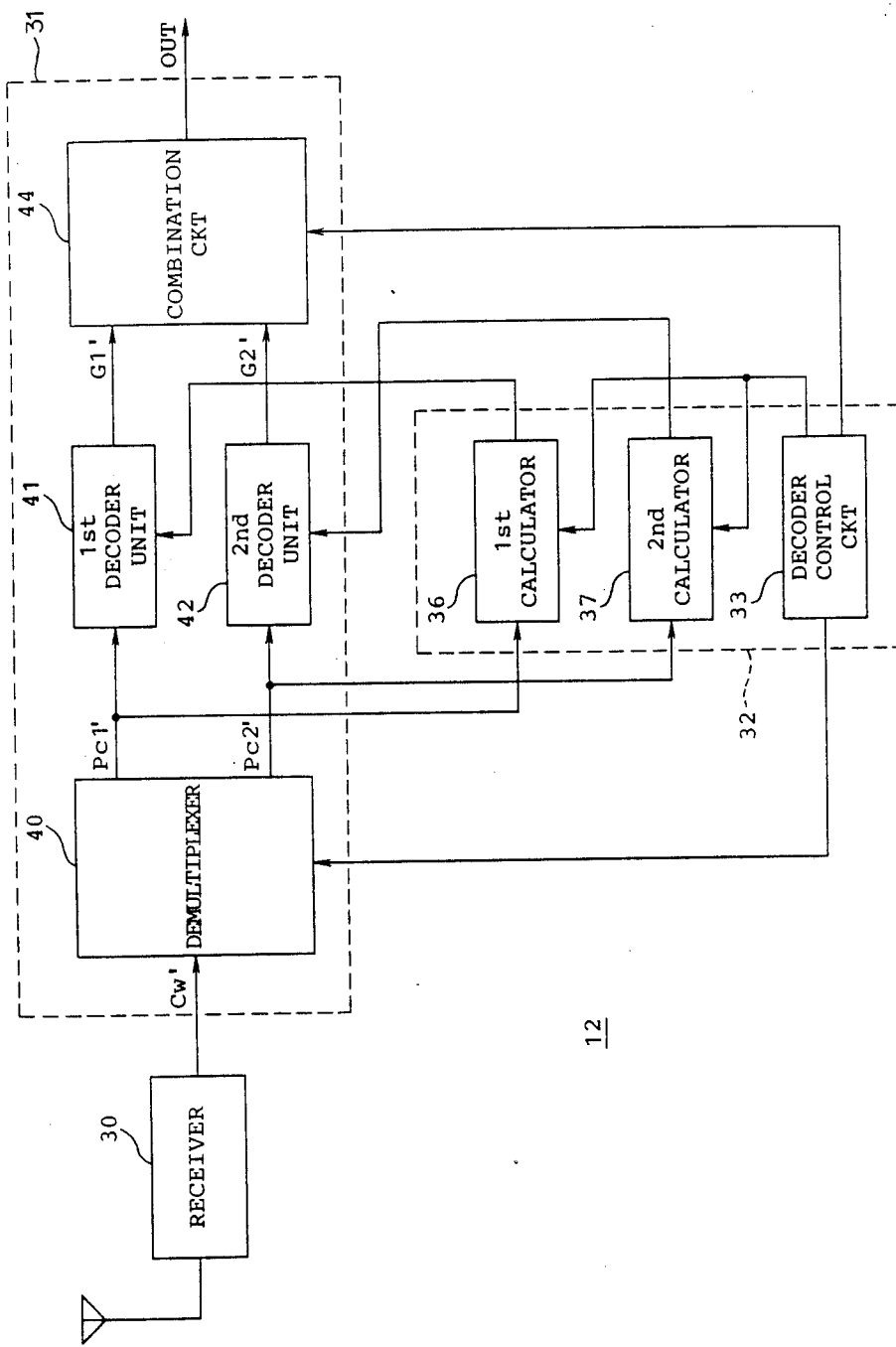
FIG. 4 is a block diagram of a decoder which is for use in combination with the encoder illustrated in FIG. 3.

Referring to FIGS. 2 through 4, an error correcting system according to an embodiment of this invention carries out error correction by the use of a codeword which has a format illustrated in FIG. 2 and which has a full or total code length B'. The codeword is transmitted at a transmission rate through a transmission path having an allowable frequency band, as described in conjunction with FIG. 1. In FIG. 2, the full code length B' of the codeword is not equal to the code length B of the codeword illustrated in FIG. 1 but is selected in consideration of an allowable transmission rate in the allowable frequency band of the radio channel. It is assumed that the information signal unit has N bits like in FIG. 1. In the example being illustrated, the information signal unit of N bits is divided or grouped into a first part of N1 bits and a second part of N2 bits. The first and the second parts are individually followed by a first redundancy signal of K1 bits and a second redundancy signal of K2 bits to form first and second partial encoded codewords of B1 and B2 bits, respectively. The first partial encoded codeword is combined with the second partial encoded codeword to be transmitted as an error correcting codeword of B' bits from the transmitter section 11 to the receiver section 12 through the transmission path.

It is possible to adjust the transmission rate of the error correcting codeword to the allowable transmission rate of the allowable frequency band by selecting the bit numbers of the first and the second parts. Therefore, the allowable frequency band can be effectively used without an unused frequency band remaining in the allowable frequency band. In addition, the first partial encoded codeword of B1 bits may have an error correcting ability different from that of the second partial encoded codeword of B2 bits. For example, the first partial encoded codeword of B1 bits may have the error correction ability of a single error while the second partial encoded codeword of B2 bits may have the error correction ability of a double error.

On the other hand, it is assumed that the information signal unit of N bits cannot be encoded into a codeword having the error correction ability of a double error because such a codeword brings about an excessive increase of a transmission rate which exceeds the allowable transmission rate of the transmission path illustrated in FIG. 1, although an unused frequency band is left in the allowable frequency band.

When the codeword illustrated in FIG. 2 is compared with that illustrated in FIG. 1, taking the above into consideration, it is readily understood that the former has an excellent error correction ability in comparison with the latter.

In order to perform the error correction by the use of the codeword illustrated in FIG. 2, the error correcting system comprises a transmitter section 11 (as shown in FIG. 3) and a receiver section 12 (as shown in FIG. 4) which is communicable with the transmitter section 11 through the transmission path.

In FIG. 3, the transmitter section 11 comprises an encoder circuit 15, an encoder controller 16, a transmitter 17, and an antenna (unnumbered). The encoder 15 is supplied from a signal source (not shown) with a sequence of input signal units IN each of which is composed of N bits like in FIGS. 1 and 2. In the illustrated example, each of the input signal units IN is assumed to be given at every input signal unit IN in a bit parallel fashion and is delivered to a signal distributor 20 controlled by the encoder controller 16, as will become clear. Each of the input signal units IN is divided or grouped by the signal distributor 20 into the first part of N1 bits and the second part of N2 bits, as mentioned in conjunction with FIG. 2. The first and the second parts are depicted at G1 and G2 in FIG. 3, respectively. The bit numbers N1 and N2 of the first and the second parts G1 and G2 are determined in consideration of the error correcting ability and the allowable frequency band (namely, the allowable transmission rate) of the transmission path. Anyway, the signal distributor 20 serves to group each of the input signal units IN and may be called a signal grouping circuit.

Herein, it is assumed for brevity of description that the first part G1 is encoded by a first encoder unit 21 into a first partial codeword which has the error correction ability of a single error while the second part G2 is encoded by a second encoder unit 22 into a second partial codeword which has the error correction ability of a double error.

Division of each input signal unit IN is determined in an encoder control circuit 23 of the encoder controller 16 in accordance with a rule determined in relation to the allowable transmission rate. In other words, the encoder control circuit 23 produces control signals in accordance with the rule. Specifically, the encoder control circuit 23 delivers a distribution control signal as one of the control signals to the signal distributor 20 to make the same distribute the first and the second parts G1 and G2 to the first and the second encoder units 21 and 22, respectively. In this event, the first and the second parts G1 and G2 are also distributed or sent to first and second calculation circuits 26 and 27 of the encoder controller 16. The first and the second calculation circuits 21 and 22 are controlled by calculation control signals given as ones of the control signals from the encoder control circuit 23.

Responsive to the calculation control signals, the first and the second calculation circuits 26 and 27 are enabled to calculate first and second redundancy bits in relation to the first and the second parts G1 and G2 in a known manner, respectively. The first and the second redundancy bits may be composed of K1 and K2 bits, as shown in FIG. 2 and are delivered to the first and the second encoder units 21 and 22. The first and the second redundancy bits are added to the first and the second parts G1 and G2, respectively. As a result, the first and the second parts G1 and G2 are encoded by the first and the second encoder units 21 and 22 into the first and the second partial encoded codewords which are depicted at Pc1 and Pc2 and which have code lengths of B1 and B2. The first and the second partial encoded codewords Pc1 and Pc2 are combined together under control of the encoder control circuit 23 by a signal combiner 29 into a single one of the error correcting codewords which is depicted at Cw in FIG. 3 and which is produced in a bit series fashion with a format illustrated in FIG. 2. The codeword Cw is sent from the signal combiner 29 through the transmitter 17 to the antenna and is thereafter delivered as a transmission signal through the radio channel to the receiver section 12 shown in FIG. 4.

A combination of the first and the second encoder units 21 and 22 and the encoder controller 16 may be collectively referred to as an encoder which serves to encode the first and the second parts G1 and G2 into the first and the second partial encoded codewords Pc1 and Pc2.

With this structure, the codeword Cw can be transmitted at the transmission rate which is very close to the allowable transmission rate of the allowable frequency band. Accordingly, it is possible to effectively use the allowable frequency band.

The receiver section 12 illustrated in FIG. 4 comprises an antenna (unnumbered), a receiver 30, a decoder circuit 31, a decoder controller 32. The decoder controller 32 comprises a decoder control circuit 33, a first calculator 36, and a second calculator 37. The decoder control circuit 33 produces decoder control signals in accordance with a rule similar to that determined for the encoder circuit 15 illustrated in FIG. 3. The first and the second calculators 36 and 37 carry out calculations predetermined for error correction in response to the control signals given from the decoder control circuit 33. Each of the first and the second calculators 36 and 37 is individually known in the art and therefore will not be described in detail.

The transmission signal is received by the receiver 30 through the antenna and is sent as a received codeword Cw' to the decoder 31. The received codeword Cw' is identical with the error correcting codeword Cw on occurrence of no error during the transmission of the error correcting codeword Cw and is supplied to that demultiplexer 40 of the decoder 31 which demultiplexes the received codeword Cw into first and second demultiplexed codewords Pc1' and Pc2' which are reproductions of the first and the second partial encoded codewords Pc1 and Pc2, respectively, and which have code lengths of B1 and B2 bits, as illustrated in FIG. 2. The first and the second demultiplexed codewords Pc1' and Pc2' are delivered to first and second decoder units 41 and 42 of the decoder 31 on one hand and to the first and the second calculators 36 and 37 of the decoder controller 32, respectively, on the other hand.

Supplied with the first and the second demultiplexed codewords Pc1' and Pc2', the first and the second calculators 36 and 37 carry out the calculations to detect presence or absence of errors in the first and the second demultiplexed codewords Pc1' and Pc2', to detect positions of the errors when any errors are present, and to supply the first and the second decoder units 41 and 42 with error position signals indicative of the error positions. More specifically, the calculations carried out in the first and the second calculators 36 and 37 may be divisions of the first and the second demultiplexed signals Pc1' and Pc2' by polynomials predetermined for the first and the second demultiplexed codewords Pc1' and Pc2', respectively, as known in the art.

The first and the second decoder units 41 and 42 correct the errors of the first and the second demultiplexed codewords Pc1' and Pc2' in response to the error position signals, respectively. Thereafter, the first and the second demultiplexed codewords Pc1' and Pc2' which are subjected to error correction are decoded into first and second decoded information signals G1' and G2' which are reproductions of the first and the second parts G1 and G2 of FIG. 3, respectively. Therefore, the first and the second decoded information signals G1' and G2' are composed of N1 bits and N2 bits, respectively. Thus, a combination of the demultiplexer 40, the first and the second decoder units 41 and 42, and the decoder controller 32 serves to decode the received codeword Cw into the first and the second demultiplexed codewords Pc1' and Pc2' and may be referred to as a decoder.

The first and the second information signals G1' and G2' are combined by a combination circuit 44 into an output codeword OUT of N bits which is a reproduction of the input codeword IN. The output codeword OUT may be produced either in a bit serial fashion or in a bit parallel fashion.

Practically, let data transmission be carried out by the use of the error correcting system illustrated in FIGS. 2 through 4. In this event, it is assumed for simplification of description that the error correcting codeword Cw can be transmitted within the allowable frequency band of the transmission path when a code length of the codeword is equal to or shorter than 300 bits.

When an error correcting code of a single error is used in the conventional error correcting system on the above-mentioned assumption, the code length of B bits in a single one of the error correcting codewords (FIG. 1) should be equal to or shorter than 255 bits. In other words, K is equal to 8 and N is equal to or less than 247, as already described before. Thus, the allowable frequency band affords to transmit an additional code of 45 bits. However, such an additional code can not be transmitted in the conventional error correcting system because B becomes equal to or less than 511 when K becomes equal to 9 so as to increase N.

In the error correcting system according to this invention, it is possible to transmit the input signal unit IN even when N is increased, for example, to 267. For this purpose, the first and the second parts G1 and G2 are assumed to be encoded into the first and the second partial encoded codewords Pc1 and Pc2 which are for correcting a single error and a double error, respectively. In this case, the input signal unit IN of 267 bits is grouped into the first part G1 of 247 bits and the second part G2 of 20 bits. This shows that N1 and N2 are equal to 247 and 20, respectively. The first and the second calculation circuits 26 and 27 calculate the first and the second redundancy signals of 8 and 10 bits from the first and the second parts G1 and G2, respectively. Therefore, K1 and K2 are equal to 8 and 10, respectively.

Subsequently, the first and the second redundancy signals are added to the first and the second parts G1 and G2 to be encoded into the first and the second partial encoded codewords Pc1 and Pc2 of 255 and 30 bits, respectively. Thus, it is readily understood that B1 and B2 (FIG. 2) are equal to 255 and 30 and that the total code length B' of the single error correcting codeword Cw becomes equal to 285. Therefore, the allowable frequency band is effectively used in the error correcting system of this invention in comparison with the conventional error correcting system. Moreover, the single error correcting codeword Cw illustrated in FIG. 3 has the error correction ability higher than that illustrated in FIG. 1 because the codeword Cw partially includes the error correcting code which is capable of correcting a double error.

Herein, supposing that a ratio of the total code length B to the allowable transmission rate is defined as an allowable code ratio, the ratio becomes equal to 285/300 in the error correcting system according to this invention and 255/300 in the conventional error correcting system. Therefore, the error correcting system according to this invention can establish an improved allowable code ratio.

While this invention has thus far been described in conjunction with a preferred embodiment thereof, it will readily be possible for those skilled in the art to put this invention into practice in various other manners. For example, each input signal unit may be divided into signal parts by a factor greater than two. In addition, the signal parts may be encoded into various kinds of partial encoded codewords which may be combined together with a wide variety of code lengths.

What is claimed is:

1. An encoder for encoding input information signal units into error correcting codewords, respectively, each of which can correct an error or errors on decoding each of the error correcting codewords and which is transmitted from said encoder through a transmission path having an allowable frequency band, said encoder comprising:
    grouping means responsive to said input information signal units for grouping each input information signal unit into first through M-th information signal subunits on the basis of said allowable frequency band, where M is an integer greater than unity;
    first through M-th encoding means coupled to said grouping means an individually supplied with said first through M-th information signal subunits, respectively, for individually encoding said first through M-th information signal subunits into first through M-th encoded signal units which include said first through M-th signal information subunits and first through M-th redundancy signal units, respectively; and
    means for combining said first through M-th encoded signal subunits into a single one of said error correcting codewords.

2. An encoder as claimed in claim 1, wherein each of said error correcting codewords has a predetermined transmission frequency band which is narrower than, and close to, said allowable frequency band.

3. A decoder for decoding a sequence of reception signal units each of which is produced by dividing each of input information signal units into first through M-th information signal subunits on the basis of an allowable frequency band of a transmission path through which said reception signal units are received, by individually encoding said first through M-th information signal subunits into first through M-th encoded signal units which include said first through M-th information signal subunits and first through M-th redundancy signal units, respectively, and by combining said first through M-th encoded signal units, where M is an integer greater than unity, said decoder comprising:
    dividing means supplied with each of said reception signal units for dividing each of said reception signal units into first through M-th divided codewords representative of said first through M-th encoded signal units;
    decoding means for decoding said first through M-th divided codewords into first through M-th divided information signal subunits representative of said first through M-th information signal subunits; and
    means for combining said first through M-th divided information signal subunits into a reproduction of each of said input information signal units.

4. An error correcting system comprising an encoder for encoding input information signal units into error correcting codewords, respectively, each of which can correct an error or errors on decoding each of the error correcting codewords and is transmitted through a transmission path having an allowable frequency band, and a decoder supplied with said error correcting codewords as reception signal units for decoding said reception signal unit into each of output codewords that is a reproduction of each of said input information signal units, said encoder comprising:
    grouping means responsive to said each input information signal unit for grouping said each input information signal unit into first through M-th information signal subunits on the basis of said allowable frequency band, where M is an integer greater than unity;
    first through M-th encoding means coupled to said grouping means and individually supplied with said first through M-th information signal subunits, respectively, for individually encoding said first through M-th information signal subunits into first through M-th encoded signal units which include said first through M-th signal information subunits and first through M-th redundancy signal units, respectively; and
    means coupled to said encoding means for combining said first through M-th encoded signal subunits into a single one of said error correcting codewords;
    said decoder comprising:
    dividing means supplied with each of said reception signal units for dividing each of said reception signal units into first through M-th divided codewords representative of said first through M-th encoded signal units;
    decoding means for decoding said first through M-th divided codewords into first through M-th divided information signal subunits representative of said first through M-th information signal subunits, respectively; and
    means for combining said first through M-th divided information signal subunits into each of said output codewords.

* * * * *